(12) United States Patent
Hou

(10) Patent No.: US 11,251,241 B2
(45) Date of Patent: Feb. 15, 2022

(54) PIXEL DEFINING STRUCTURE AND FABRICATION METHOD THEREOF, DISPLAY SUBSTRATE AND JET PRINTING METHOD

(71) Applicant: BOE TECHNOLOGY GROUP CO., LTD., Beijing (CN)

(72) Inventor: Wenjun Hou, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/202,388

(22) Filed: Nov. 28, 2018

(65) Prior Publication Data
US 2019/0305060 A1     Oct. 3, 2019

(30) Foreign Application Priority Data
Mar. 27, 2018   (CN) .......................... 201810259659.7

(51) Int. Cl.
    *H01L 27/32*        (2006.01)
    *H01L 51/00*        (2006.01)
    *H01L 51/56*        (2006.01)

(52) U.S. Cl.
CPC ...... *H01L 27/3246* (2013.01); *H01L 51/0005* (2013.01); *H01L 51/56* (2013.01); *H01L 2251/558* (2013.01)

(58) Field of Classification Search
CPC . H01L 27/3246; H01L 51/0005; H01L 51/56; H01L 2251/558
(Continued)

(56) References Cited

U.S. PATENT DOCUMENTS 8,223,188 B2*   7/2012   Ryf .................. H04N 7/144
                                             348/14.01
8,912,480 B2*   12/2014   Pope ................. G01J 1/0488
                                                250/221
(Continued)

FOREIGN PATENT DOCUMENTS

CN        102577612 A      7/2012
CN        104517995 A      4/2015
(Continued)

OTHER PUBLICATIONS

Taiwanese Office Action in Taiwanese Application No. 107144480, dated Jun. 28, 2019 with English translation.
(Continued)

*Primary Examiner* — Ori Nadav
(74) *Attorney, Agent, or Firm* — Collard & Roe, P.C.

(57) ABSTRACT

A pixel defining structure and a fabrication method thereof, a display substrate and a jet printing method are provided. The pixel defining structure includes a substrate, and a plurality of pixel defining units on the substrate, including at least one first pixel defining unit and at least one second pixel defining unit which are arranged along a first direction and a second direction which intersect with each other, wherein each pixel defining unit has a first surface and a second surface opposite to each other and an opening communicating the first surface with the second surface, wherein, the inward inclination angle of at least one side edge of the at least one second pixel defining unit is smaller than the inward inclination angle of at least one side edge of the at least one first pixel defining unit.

17 Claims, 5 Drawing Sheets

(58) Field of Classification Search
USPC .......................................................... 257/40
See application file for complete search history.

(56) References Cited

U.S. PATENT DOCUMENTS

| | | | |
|---|---|---|---|
| 9,219,092 B2* | 12/2015 | JangJian | H01L 27/14632 |
| 9,268,169 B2 | 2/2016 | Jiang | |
| 9,287,423 B2* | 3/2016 | Mori | H01L 27/1462 |
| 9,590,003 B2* | 3/2017 | Nishizawa | H01L 27/14685 |
| 2004/0094768 A1 | 5/2004 | Yu et al. | |
| 2007/0115421 A1* | 5/2007 | Nonaka | G02F 1/133516 |
| | | | 349/156 |
| 2007/0200491 A1 | 8/2007 | Seo et al. | |
| 2011/0315971 A1 | 12/2011 | Rokuhara | |
| 2012/0091483 A1 | 4/2012 | Matsushima | |
| 2012/0299901 A1* | 11/2012 | Chen | G02F 1/13338 |
| | | | 345/212 |
| 2014/0183479 A1 | 7/2014 | Park et al. | |
| 2014/0206119 A1 | 7/2014 | Kang | |
| 2015/0097171 A1 | 4/2015 | Kim et al. | |
| 2016/0247862 A1* | 8/2016 | Song | H01L 27/3246 |
| 2016/0359142 A1* | 12/2016 | Huangfu | H01L 27/3246 |
| 2019/0189709 A1* | 6/2019 | Hou | H01L 27/3283 |

FOREIGN PATENT DOCUMENTS

| | | |
|---|---|---|
| CN | 104885251 A | 9/2015 |
| GN | 102969333 A | 3/2013 |
| JP | 2007-165167 A | 6/2007 |
| TW | 200417273 A | 9/2004 |
| TW | 200720717 A | 6/2007 |
| TW | 201041206 A | 11/2010 |
| TW | 201246653 A | 11/2012 |

OTHER PUBLICATIONS

Chinese Office Action in Chinese Application No. 201810259659.7, dated Mar. 12, 2020 with English translation.
Chinese Office Action in Chinese Application No. 201810259659.7, dated Aug. 31, 2020 with English translation.
Chinese Office Action in Chinese Application No. 201810259659.7, dated Jan. 8, 2021 with English translation.

* cited by examiner

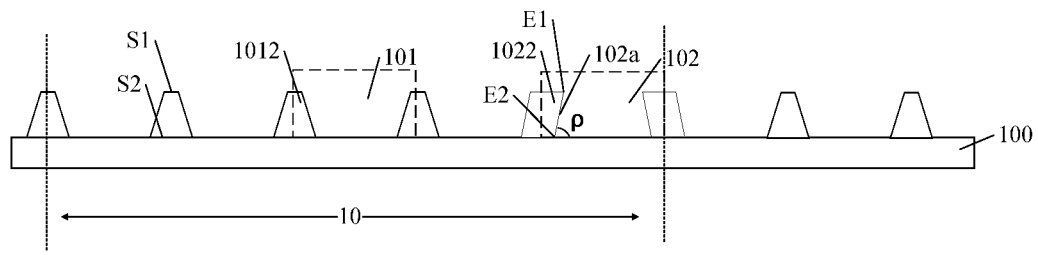
FIG. 2A
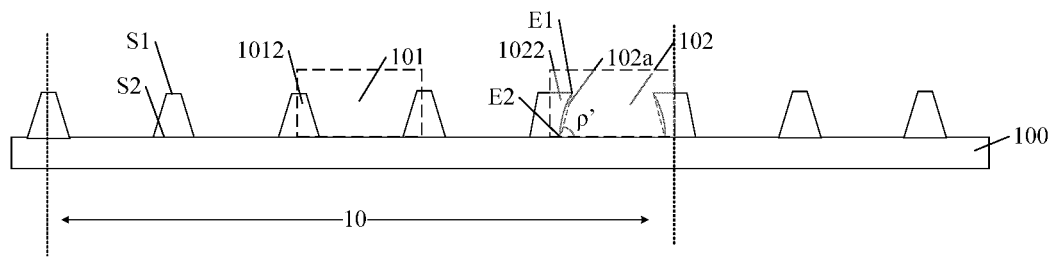
FIG. 2B
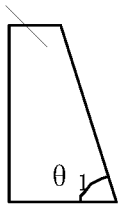 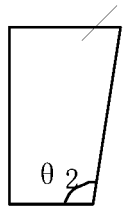
FIG. 3A  FIG. 3B
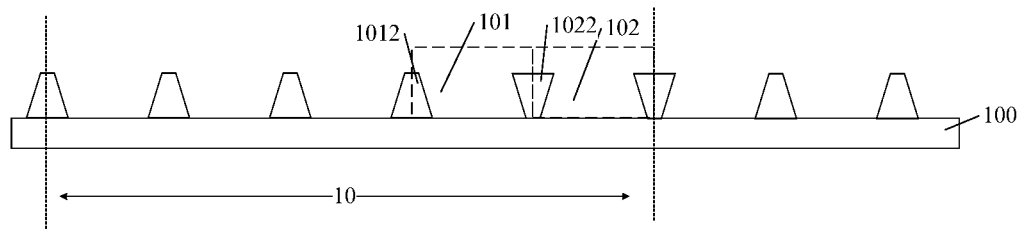
FIG. 4A
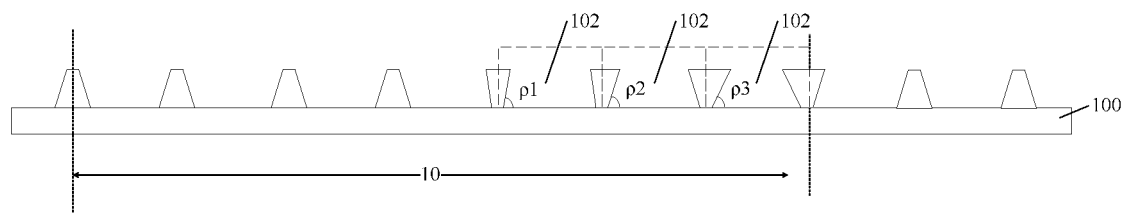
FIG. 4B

PIXEL DEFINING STRUCTURE AND FABRICATION METHOD THEREOF, DISPLAY SUBSTRATE AND JET PRINTING METHOD

CROSS REFERENCE TO RELATED APPLICATIONS

Applicant claims priority under 35 U.S.C. § 119 of Chinese Application No. 201810259659.7 filed on Mar. 27, 2018, the disclosure of which is incorporated by reference.

TECHNICAL FIELD

Embodiments of the present disclosure relate to a pixel defining structure and a fabrication method thereof, a display substrate and a jet printing method.

BACKGROUND

An organic light-emitting display apparatus has advantages of self-luminescence, fast response, wide viewing angle, high brightness, bright color, light weight, thinness and the like, so it becomes an important display technology.

An organic functional layer of the organic light-emitting display apparatus, for example, may be formed in a jet printing mode. After a pixel defining structure is formed on a base substrate, an organic functional layer is formed by utilizing a jet printing method so that the organic functional material is accurately jetted into the defined pixel regions.

SUMMARY

An embodiment of the present disclosure provides a pixel defining structure, including:
a substrate, and
a plurality of pixel defining units on the substrate, including at least one first pixel defining unit and at least one second pixel defining unit which are arranged along a first direction and a second direction which intersect with each other, wherein each pixel defining unit has a first surface and a second surface opposite to each other and an opening communicating the first surface with the second surface,
wherein, in at least one cross section of the pixel defining structure along the first direction, an inward inclination angle of the side edge of each pixel defining unit on one side of the opening is an included angle between a straight connection line of two end points of the side edge and a surface portion of the substrate exposed by the opening, the two end points of the side edge are an intersection of the side edge and the first surface and an intersection of the side edge and the second surface respectively, and the inward inclination angle of at least one side edge of the at least one second pixel defining unit is smaller than the inward inclination angle of at least one side edge of the at least one first pixel defining unit.

In one example, the at least one second pixel defining unit includes a plurality of the second pixel defining units sequentially adjacent along the second direction.

In one example, the inward inclination angles of the side edges of the plurality of second pixel defining units sequentially adjacent along the second direction are equal in essence.

In one example, the at least one second pixel defining unit includes a plurality of second pixel defining units sequentially adjacent along the first direction.

In one example, the inward inclination angles of the side edges of the plurality of second pixel defining units sequentially adjacent along the first direction are sequentially decreased.

In one example, the inward inclination angle of the at least one side edge of the at least one second pixel defining unit is an acute angle.

In one example, the inward inclination angle of the at least one side edge of the at least one first pixel defining unit is an obtuse angle.

In one example, the plurality of pixel defining units further includes:
at least one third pixel defining units, located between the at least one first pixel defining unit and the substrate; and
at least one fourth pixel defining unit, located between the at least one second pixel defining unit and the substrate,
wherein the at least one third pixel defining units and the at least one first pixel defining units are correspondingly overlapped, and the at least one fourth pixel defining unit and the at least one second pixel defining unit are correspondingly overlapped,
wherein in the at least one cross section of the pixel defining structure along the first direction, the inward inclination angle of at least one side edge of the at least one third pixel defining unit is an obtuse angle, and the inward inclination angle of at least one side edge of the at least one fourth pixel defining unit is an obtuse angle.

In one example, a material of the at least one first pixel defining unit and the at least one second pixel defining unit is a lyophilic material; and
a material of the at least one third pixel defining unit and the at least one fourth pixel defining unit a lyophilic material.

In one example, in a direction perpendicular to the substrate, a thickness of the at least one first pixel defining unit and the at least one second pixel defining unit are greater than a thickness of the at least one third pixel defining unit and the at least one fourth pixel defining unit.

In one example, the number of the plurality of second pixel defining units sequentially adjacent along the first direction is 2 to 5.

Another embodiment of the present disclosure provides a jet printing method by adopting any of the pixel defining structures described above, including:
simultaneously jetting a material to at least part of the plurality of pixel defining units by adopting a plurality of nozzles in one-to-one correspondence, wherein at least one jet nozzle at an edge of the plurality of nozzles jets the material to the at least one second pixel defining unit.

In one example, the jet printing method further includes:
jetting the material row by row along the second direction intersecting with the first direction by adopting the plurality of nozzles.

Yet another embodiment of the present disclosure provides a display substrate, including any of the pixel defining structures described above and an organic functional layer;
wherein the organic functional layer is positioned in the openings defined by at least part of the plurality of pixel defining units.

In one example, the organic functional layer includes at least one selected from the group consisting of a light emitting layer, an electron injection layer, a hole injection layer, an electron transport layer and a hole transport layer.

In one example, the plurality of pixel defining units further includes:
at least one third pixel defining units, located between the at least one first pixel defining unit and the substrate; and at least one fourth pixel defining unit, located between the at least one second pixel defining unit and the substrate, wherein the at least one third pixel defining units and the at least one first pixel defining units are correspondingly overlapped, and the at least one fourth pixel defining unit and the at least one second pixel defining unit are correspondingly overlapped, wherein in the at least one cross section of the pixel defining structure along the first direction, the inward inclination angle of at least one side edge of the at least one third pixel defining unit is an obtuse angle, and the inward inclination angle of at least one side edge of the at least one fourth pixel defining unit is an obtuse angle, wherein a surface of the organic functional layer facing away from the substrate is substantially flush with surfaces of the at least one third pixel defining units and the at least one fourth pixel defining unit face away from the substrate.

In one example, a material of the at least one first pixel defining units and the at least one second pixel defining unit is a lyophobic material; and a material the at least one third pixel defining units and the at least one fourth pixel defining unit is a lyophilic material.

In one example, in a direction perpendicular to the substrate, a thickness of the at least one first pixel defining unit and the at least one second pixel defining unit are greater than a thickness of the at least one third pixel defining unit and the at least one fourth pixel defining unit.

Yet another embodiment of the present disclosure provides a fabrication method of a pixel defining structure, including:

forming a plurality of pixel defining units on a substrate, wherein the plurality of pixel defining units include at least one first pixel defining unit and at least one second pixel defining unit which are arranged along a first direction and a second direction which intersect with each other, wherein each pixel defining unit has a first surface and a second surface opposite to each other and an opening communicating the first surface with the second surface, wherein in at least one cross section of the pixel defining structure along the first direction, an inward inclination angle of the side edge of each pixel defining unit on one side of the opening is an included angle between a straight connection line of two end points of the side edge and a surface portion of the substrate exposed by the opening, the two end points of the side edge are an intersection of the side edge and the first surface and an intersection of the side edge and the second surface respectively, and the inward inclination angle of at least one side edge of the at least one second pixel defining unit is smaller than the inward inclination angle of at least one side edge of the at least one first pixel defining unit.

In one example, the fabrication method of the pixel defining structure further includes:

forming at least one third pixel defining unit between the at least one first pixel defining unit and the substrate; and forming at least one fourth pixel defining unit between the at least one second pixel defining unit and the substrate;

wherein the at least one third pixel defining unit and the at least one first pixel defining unit are correspondingly overlapped, and the at least one fourth pixel defining unit and the at least one second pixel defining unit are correspondingly overlapped, wherein in the at least one cross section of the pixel defining structure along the first direction, the inward inclination angle of at least one side edge of the at least one third pixel defining unit is an obtuse angle, and the inward inclination angle of at least one side edge of the at least one fourth pixel defining unit is an obtuse angle.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

FIG. 2A and FIG. 2B are two sectional schematic diagrams of the pixel defining structure in FIG. 1A along an A-A line;

FIG. 3A and FIG. 3B are schematic diagrams of a positive trapezoid and an inverted trapezoid in a pixel defining structure provided by an embodiment of the present disclosure;

FIG. 4A is another sectional schematic diagram of the pixel defining structure in FIG. 1A along the A-A line;

FIG. 4B is a sectional schematic diagram of another example of a pixel defining structure;

DETAILED DESCRIPTION

Figure 1A:
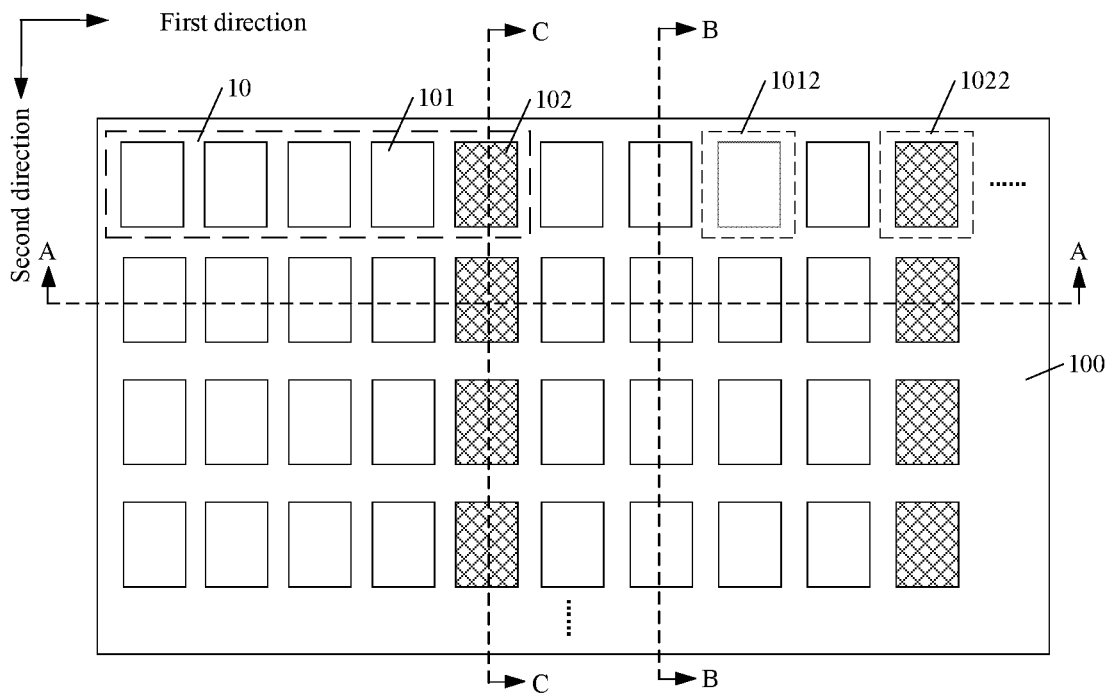
FIG. 1A and FIG. 1B are plane schematic diagrams of a pixel defining structure provided by an embodiment of the present disclosure.

In order to make objects, technical solutions and advantages of the embodiments of the disclosure apparent, the technical solutions of the embodiments of the disclosure will be described in a clearly and fully understandable way in connection with the drawings related to the embodiments of the disclosure. It is obvious that the described embodiments are just a part but not all of the embodiments of the disclosure. Based on the described embodiments of the disclosure, those skilled in the art can obtain all other embodiment(s), without any inventive work, which should be within the scope of the disclosure.

Unless otherwise defined, the technical terms or scientific terms here should be of general meaning as understood by those ordinarily skilled in the art. In the present disclosure, words such as "first", "second" and the like do not denote any order, quantity, or importance, but rather are used for distinguishing different components. Words such as "include" or "comprise" and the like denote that elements or objects appearing before the words of "include" or "comprise" cover the elements or the objects enumerated after the words of "include" or "comprise" or equivalents thereof, not exclusive of other elements or objects. Words such as "connected" or "connecting" and the like are not limited to physical or mechanical connections, but may include electrical connection, either direct or indirect. Words such as "up", "down", "left", "right" and the like are only used for expressing relative positional relationship, when the absolute position of a described object is changed, the relative positional relationship may also be correspondingly changed.

Generally, a pixel defining structure of a display substrate has a plurality of openings. When jet printing is carried out in those openings by utilizing a jet printing method, if all the openings are jet printed in one jet printing, a great number of nozzles are required. Due to volume differences among different nozzles, before jet printing, each jet nozzle needs to be subjected to volume calibration so as to enable a volume of ink jetted and printed by each jet nozzle to be basically the same. However, in a case of a large number of nozzles, it takes long time to calibrate the respective jet nozzles, and materials are wasted. For example, jet printing on the pixel defining structure with a large area may be completed in a mode of performing repeated jet printing by a small amount of nozzles. In this case, in the process of performing jet printing on a great number of openings of the pixel defining structure by utilizing the small amount of nozzles, the number of the openings which can be printed by performing a single jet printing is the same with that of the nozzles. The ink which is firstly jetted and printed in the openings is dried firstly. In the single jet printing process, due to different environmental atmospheres, drying speeds of the ink jetted and printed in the openings at different positions are inconsistent. Generally, the drying speeds of the ink jetted and printed in the edge openings are relatively high, and the drying speeds of the ink jetted and printed in the internal openings are relatively low, resulting in uneven forms(commonly known as swath mura) after the ink jetted and printed in the openings at different positions are dried. For example, when an organic material is printed in the pixel defining structure by utilizing the jet printing method to form an organic functional layer, the organic functional layers formed in the openings at different positions are uneven in form (for example, thickness), resulting in uneven display brightness of the display substrate in the working process, this seriously affecting a display effect of the display substrate.

At least an embodiment of the present disclosure provides a pixel defining structure, including: a pixel defining layer arranged on a base substrate, wherein the pixel defining layer includes a plurality of pixel defining groups periodically arranged at least along a first direction; each pixel defining group includes a second pixel defining unit, and the second pixel defining unit is positioned at the edge position of one side or both sides of the pixel defining group in the first direction; and in a cross section of the second pixel defining unit in the first direction, at least one side edge facing an opening of the second pixel defining unit is an inward inclination side edge.

At least an embodiment of the present disclosure provides a method for performing jet printing by utilizing the above-mentioned pixel defining structure. The method includes: performing jet printing on the pixel defining structure group by group by taking a pixel defining group as the unit.

At least an embodiment of the present disclosure provides a display substrate, and the above-mentioned display substrate includes the pixel defining structure and an organic functional layer; and the organic functional layer is arranged in an opening formed by the second pixel defining unit of the pixel defining structure.

At least an embodiment of the present disclosure provides a fabrication method of a pixel defining structure, including: forming a plurality of pixel defining groups on a base substrate, which are periodically arranged at least along a first direction, wherein each pixel defining group includes a second pixel defining unit, and the second pixel defining unit is formed at the edge position of one side or both sides of the pixel defining group in the first direction; and in a cross section of the second pixel defining unit in the first direction, at least one side edge facing an opening of the second pixel defining unit is an inward inclination side edge.

The pixel defining structure and the fabrication method thereof, the jet printing method and the display substrate according to the present disclosure will be illustrated below by some specific embodiments.

An embodiment of the present disclosure provides a pixel defining structure. The pixel defining structure can be used for forming an array substrate of an Organic Light-Emitting Diode (OLED) display panel, for example. FIG. 1A is a plane schematic diagram of a pixel defining structure provided by the embodiment, and FIG. 2A is a sectional schematic diagram of the pixel defining structure in FIG. 1A along an A-A line. As shown in FIG. 1A, the pixel defining structure includes a pixel defining layer arranged on a base substrate 100. The pixel defining layer includes a plurality of pixel defining groups 10 periodically arranged at least along a first direction (for example, a horizontal direction in the drawing). Each pixel defining group 10 includes a plurality of first pixel defining units 1012 and a second pixel defining units 1022. Each first pixel defining unit 1012 defines a first opening 101; and each second pixel defining unit 1022 defines a first opening 102. The second pixel defining unit 1022 is positioned at the edge position of one side or both sides of the pixel defining group 10 in the first direction. Each pixel defining unit surrounds to define one opening (for example, a solid line box portion in the drawing). Herein, the opening can be a concave portion or a through hole with a certain depth in a direction perpendicular to the substrate. A plurality of openings arranged in an array are defined by the pixel defining layer, the openings of each two adjacent pixel defining units are separated by a strip portion in the pixel defining layer. The strip portion, for example, is formed by the two adjacent pixel defining units together, or a center line of the strip portion divides the strip portion into two portions which respectively belong to the two adjacent pixel defining units. When the pixel defining structure is used for performing jet printing, ink can be jetted and printed in the opening of each pixel defining unit.

For example, in a cross section of the second pixel defining unit 1022 in the first direction, at least one side edge facing the opening of the second pixel defining unit 1022, e.g., a side edge 102a in the drawing, is an inward inclination side edge, i.e., the side edge 102a is inclined towards the opening of the second pixel defining unit 1022. For example, an included angle between the inward inclination side edge 102a and a surface portion of the base substrate 100, which corresponds to (is exposed at) the position of the opening of the second pixel defining unit 1022 is an acute angle such as the angle ρ shown in FIG. 2A; correspondingly, if an included angle ρ between a side edge and the surface of a surface portion of the base substrate 100 exposed by the opening of the corresponding pixel defining unit is an obtuse angle, then the side edge is an outward inclination side edge.

For example, in one example, in a plan view, the opening of the second pixel defining unit 1022 is formed to be a rectangular shape; in the cross section of the second pixel defining unit 1022 in the first direction, both side edges facing the opening of the second pixel defining unit 1022 are the inward inclination side edges. In the embodiment, each pixel defining group 10, for example, further includes the first pixel defining unit 1012, and the first pixel defining unit 1012 is at least positioned at the middle position of each pixel defining group 10. For example, the first pixel defining unit 1012 and the second pixel defining unit 1022 may have the same layout, and for example, may have the same plane profile and the same opening shape.

For example, in one example of the embodiment, as shown in FIG. 2A, in the cross section of in the first direction, the first pixel defining unit 1012 includes a positive trapezoid portion; in the cross section in the first direction, the second pixel defining unit 1022 includes an inverted trapezoid portion. For example, the inward inclination side edge is a hypotenuse of the inverted trapezoid. In another example, the cross section of the second pixel defining unit 1022 in the first direction, for example, includes a parallelogram portion (the parallelogram portion means one portion of a parallelogram, and two adjacent parallelogram portions, for example, may form one complete parallelogram) so as to replace the above-mentioned inverted trapezoid portion, and the parallelogram portion can also includes an inward inclination side edge inclined towards the opening of the second pixel defining unit.

For example, the inward inclination side edge may be of a straight line or arc shape. For example, in another example of the embodiment, as shown in FIG. 2B, the inward inclination side edge, for example, may also have a certain curvature or bend, for example, as long as the inward inclination side edge is inclined towards the opening of the second pixel defining unit 1022, and the embodiments do not limit the specific form of the inward inclination side edge. Similarly, the outward inclination side edge may also have a certain curvature or bend.

For example, FIG. 1A shows a case where the first pixel defining units 1012 and the second pixel defining unit 1022 in one row are selected as one pixel defining group 10; the second pixel defining unit 1022 is on one side (the right side as shown in the drawing) of the pixel defining group 10 in the first direction, and each pixel defining group 10 includes one second pixel defining unit 1022. In another embodiment, each pixel defining group, for example, may include 1 to 5 second pixel defining units, such as 2, 3 or 4 second pixel defining units and the like. For example, when plural second pixel defining units are included in each pixel defining group, the second pixel defining units may be on one side of each pixel defining group, and may also be on both sides of each pixel defining group.

Figure 1B:
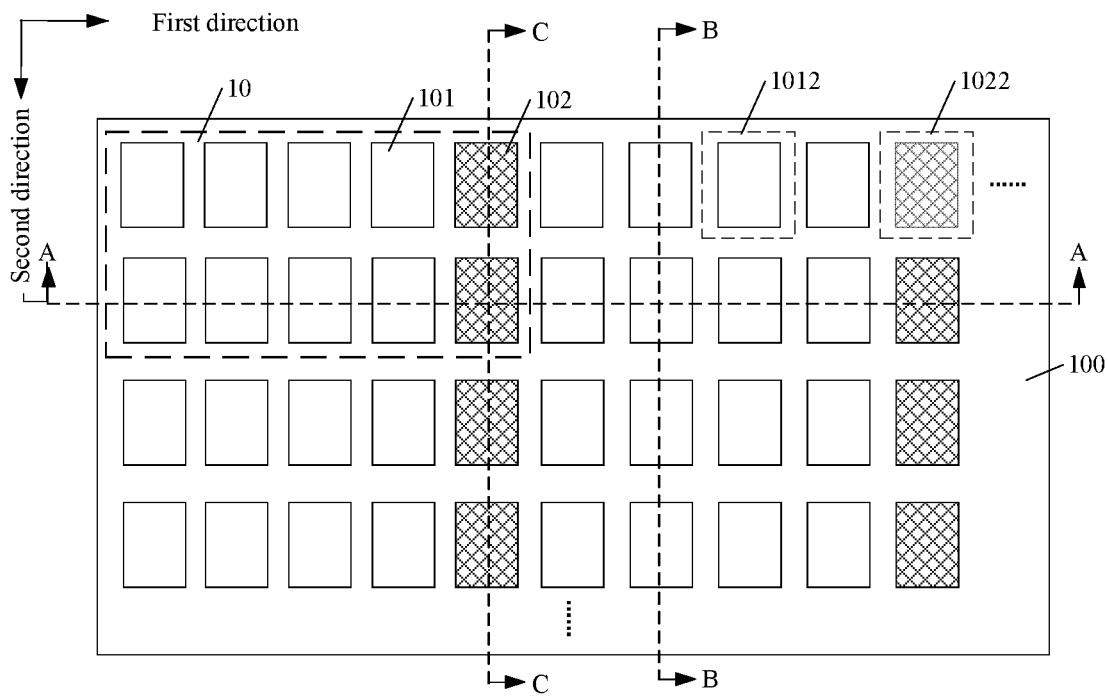

In yet another embodiment, as shown in FIG. 1B, for example, the first pixel defining units 1012 and the second pixel defining units 1022 in multiple rows (two rows are shown in the drawing), may also be selected as one pixel defining group. In this case, each pixel defining group 10, for example, includes one or more columns of second pixel defining units 1022 (one column is shown in the drawing) on one side of the pixel defining group 10 in the first direction.

For example, FIG. 3A and FIG. 3B show schematic diagrams of a positive trapezoid portion of the first pixel defining unit 1012 and an inverted trapezoid portion of the second pixel defining unit 1022 in FIG. 2A. As shown in FIG. 3A, the positive trapezoid portion includes a short upper edge and a long bottom edge, one hypotenuse and the bottom edge of the positive trapezoid portion form a right angle, the other hypotenuse and the bottom edge form an acute angle, i.e., an angle θ1 shown in FIG. 3A, and for example, a size of θ1 is 30° to 60°, such as 35°, 45° or 50° and the like, and the embodiments do not make specific definition thereto. As shown in FIG. 3B, the inverted trapezoid portion includes a long upper edge and a short bottom edge, one hypotenuse and the bottom edge of the inverted trapezoid portion form a right angle, the other hypotenuse and the bottom edge form an obtuse angle, i.e., an angle θ2 shown in FIG. 3B, for example, a size of θ2 is 120° to 150°, such as 130°, 140° or 145° and the like, and the embodiments do not make specific definition thereto.

For example, in FIG. 2A, the positive trapezoid portions of two adjacent first pixel defining units 1012 can form one complete positive trapezoid structure, e.g., an isosceles positive trapezoid structure; and the positive trapezoid portion and the inverted trapezoid portion of the adjacent first pixel defining unit 1012 and second pixel defining unit 1022 can form one complete quadrangle structure, e.g., a parallelogram structure.

For example, in another example of the embodiment, as shown in FIG. 4A, the first pixel defining unit 1012 adjacent to the second pixel defining unit 1022 may also include the inverted trapezoid portion on the side abutting with the second pixel defining unit 1022, so that the inverted trapezoid portions of the adjacent first pixel defining unit 1012 and second pixel defining unit 1022 can form one complete inverted trapezoid structure, e.g., the isosceles inverted trapezoid structure.

For example, the first pixel defining unit and the second pixel defining unit may be made of a photoresist material, and for example, may adopt a material with a lyophobic property, e.g., a negative photoresist material with the lyophobic property, such as polyimide (PI), polymethyl methacrylate (PMMA) or organic silicon and the like, so that the first pixel defining unit and the second pixel defining unit may be formed by an exposure process and a development process, thereby simplifying a fabrication process. Corresponding to the embodiment, for example, a portion of the base substrate, which is exposed by the opening of each pixel defining unit, has the lyophilic property, and for example, lyophilic processing is carried out on the portion.

In the above-mentioned embodiment, in the cross section of the first direction, at least one side edge of the first pixel defining unit 1012 is the outward inclination side edge, and at least one side edge of the second pixel defining unit 1022 is the inward inclination side edge, but the present disclosure is not limited thereto. In the embodiment of the present disclosure, in at least one cross section of the pixel defining structure, an inward inclination angle of at least one side edge of the at least one second pixel defining unit is smaller than an inward inclination angle of at least one side edge of the at least one first pixel defining unit. Therefore, a difference between a drying speed of an organic material jetted into the opening of the second pixel defining unit at the edge of the pixel defining group and a drying speed of the organic material jetted into the opening of the first pixel defining unit at the middle position of the pixel defining group can be reduced.

Here, with reference to FIG. 2A and FIG. 2B, each pixel defining unit has a first surface S1 and a second surface S2 opposite to each other and an opening communicating the first surface S1 with the second surface S2. In at least one cross section of the pixel defining structure along the first direction, the inward inclination angle of a side edge 102a of each pixel defining unit, which is on one side of the opening defined by the pixel defining unit, is an included angle between a straight connection line of two end points E1 and E2 of the side edge 102a and a surface portion of the substrate, which is exposed by the opening. The two end points E1 and E2 of the side edge are an intersection of the side edge 102a and the first surface S1 and an intersection of the side edge 102a and the second surface S2 respectively. Herein, the straight connection line can be virtual and not necessarily actual.

With reference to FIG. 2A, the side edge 102a of the pixel defining unit is a straight line edge, the inward inclination angle of the side edge 102a is an included angle ρ between the straight connection line of two end points E1 and E2 of the side edge 102a and the surface portion of the substrate exposed by the opening. In a case that the side edge of the pixel defining unit has a certain curvature or bend, for example, with reference to FIG. 2B, the inward inclination angle of the side edge 102a of the pixel defining unit is an included angle ρ' between the connection line (with reference to dotted lines in FIG. 2B) of two end points E1 and E2 of the side edge 102a and the surface portion of the substrate exposed by the opening.

In another example, the inward inclination angles of the side edges of three second pixel defining units 1022 sequentially adjacent along the first direction are sequentially decreased. With reference to FIG. 4B, included angles ρ1 to ρ3 of the side edges of the three second pixel defining units, which face the openings defined by the three second pixel defining units respectively, with respect to the surface portions of the substrate exposed by the openings, meet that: ρ1>ρ2>ρ3. Therefore, the difference among the drying speed of the organic material jetted into the openings of the respective pixel defining unit in the pixel defining group can be further reduced.

Figure 5:
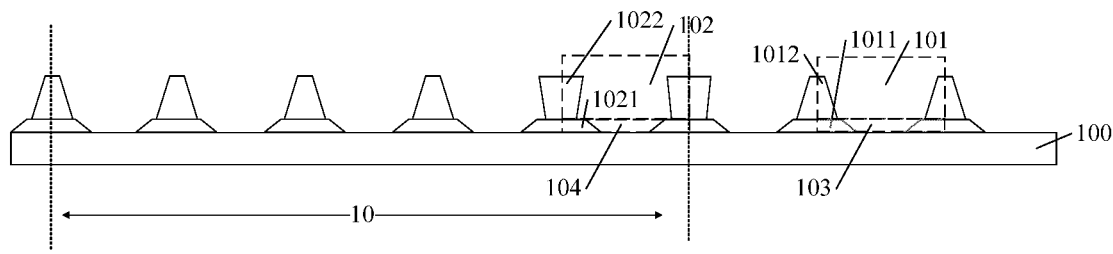
FIG. 5 is yet another sectional schematic diagram of the pixel defining structure in FIG. 1A along the A-A line.

For example, in another example of the embodiment, as shown in FIG. 5, the pixel defining structure further includes a plurality of third pixel defining units 1011 and at least one fourth pixel defining unit 1021, which are positioned between the plurality of first pixel defining units 1012 and the at least one second pixel defining unit 1022 and the substrate 100 respectively. The plurality of third pixel defining units 1011 and the plurality of first pixel defining units 1012 are correspondingly overlapped, and the at least one fourth pixel defining unit 1021 and the at least one second pixel defining unit 1022 are correspondingly overlapped. In the cross section of the pixel defining structure shown in FIG. 5, at least one side edge of each third pixel defining unit 1011 is an outward inclination side edge, and at least one side edge of the at least one fourth pixel defining unit 1021 is an outward inclination side edge.

With further reference to FIG. 5, an opening 101 defined by the first pixel defining unit 1012 is communicated with an opening 103 defined by the third pixel defining unit 1011 right below the first pixel defining unit 1012, i.e., the first pixel defining unit 1012 and the third pixel defining unit 1011 right below the first pixel defining unit 1012 define one opening together; and an opening 102 defined by the second pixel defining unit 1022 is communicated with an opening 104 defined by the fourth pixel defining unit 1021 right below the second pixel defining unit 1022, i.e., the second pixel defining unit 1022 and the fourth pixel defining unit 1021 right below the second pixel defining unit 1022 define one opening together.

For example, in this example, the first pixel defining unit 1012 and the second pixel defining unit 1022 are in the same layer, and the first pixel defining unit 1012 and the second pixel defining unit 1022 are made of a lyophobic material. The lyophobic material, for example, may be a negative photoresist material with the lyophobic property, such as PI, PMMA or organic silicon and the like. For example, the third pixel defining unit 1011 and the fourth pixel defining unit 1021 are in the same layer, and the third pixel defining unit 1011 and the fourth pixel defining unit 1021 are made of a lyophilic material (the surface of the material is easy to wet by ink for jet printing). The lyophilic material, for example, may be silicon dioxide, silicon nitride or silicon oxynitride and the like.

In this example, when the material with the lyophilic property is adopted to form a first layer of pixel defining units closer to one side of the base substrate, the first layer of pixel defining units can make the ink for jet printing easy to spread at the bottoms of the openings of the pixel defining units and enable the ink to be more uniformly distributed in the openings. When the material with the lyophobic property is adopted to form a second layer of pixel defining units on the side more away from the base substrate, the second layer of pixel defining units are difficult to wet by the ink, and thus, diffusion resistance of the ink jetted and printed in the opening can be increased, so as to retard a climbing speed of the ink on the side wall of the opening and prevent the ink from flowing into the adjacent openings.

For example, in this example, a thickness of the second pixel defining unit 1022 is greater than a thickness of the fourth pixel defining unit 1021. For example, the thickness of the second pixel defining unit 1022 is at least twice of the thickness of the fourth pixel defining unit 1021. For example, a thickness of the first pixel defining unit 1012 is greater than a thickness of the third pixel defining unit 1011. For example, the thickness of the first pixel defining unit 1012 is at least twice of the thickness of the third pixel defining unit 1011. The thicknesses of the third pixel defining unit 1011 and the fourth pixel defining unit 1021 are 50 nm to 300 nm, such as 100 nm, 150 nm, 200 nm or 250 nm and the like. For example, the thicknesses of the first pixel defining unit 1012 and the second pixel defining unit 1022 are 0.2 μm to 2 μm, such as 0.5 μm, 1 μm, 1.5 μm or 1.8 μm and the like. In such thickness setting, the ink jetted and printed in the opening of each pixel defining unit is spread more uniformly, and the second layer of pixel defining units can provide effective blocking and prevent the ink from flowing into the adjacent openings.

For example, in this example, the third pixel defining units and the fourth pixel defining units may be the same in structure, and for example, are both of a positive trapezoid structure, so that the spread form of the ink jetted and printed in the opening of each pixel defining unit is basically the same, thereby enabling the form of the dried ink to be basically the same.

Figure 6:
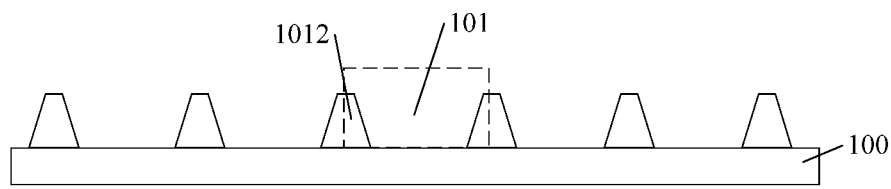
FIG. 6 is a sectional schematic diagram of the pixel defining structure in FIG. 1A along a B-B line.
Figure 7:
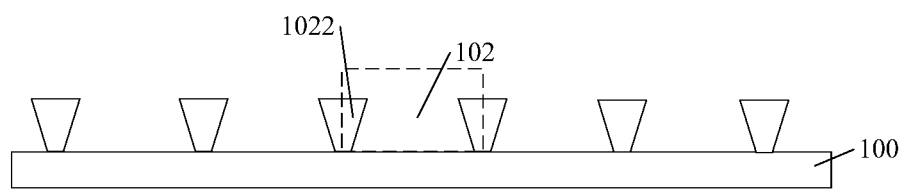
FIG. 7 is a sectional schematic diagram of the pixel defining structure in FIG. 1A along a C-C line.

In the embodiment, shapes of the first pixel defining unit and the second pixel defining unit, in a section perpendicular to the first direction, may be the same, and may also be different. For example, FIG. 6 is a sectional schematic diagram of the pixel defining structure in FIG. 1A along a B-B line, and FIG. 7 is a sectional schematic diagram of the pixel defining structure in FIG. 1A along a C-C line. For example, as shown in FIG. 6, the section of the first pixel defining unit 101 in the second direction perpendicular to the first direction, for example, includes an outward inclination side edge (i.e., a side edge inclined in a mode of away from the opening of the first pixel defining unit 101), and for example, includes a positive trapezoid. As shown in FIG. 7, the section of the second pixel defining unit 1022 in the second direction perpendicular to the first direction, for example, includes an inward inclination side edge, and for example, includes an inverted trapezoid. For example, in the cross section of the second pixel defining unit 1022, which is perpendicular to the first direction, the side edges facing the opening of the second pixel defining unit 1022 are all the inward inclination side edges. At the moment, four side edges of the second pixel defining unit 1022 are all the inward inclination side edges.

For example, the section of the second pixel defining unit 1022 in the second direction may also include an outward inclination side edge and for example, is of a positive trapezoid shape as shown in FIG. 6, and at the moment, the sections of the first pixel defining unit 101 and the second pixel defining unit 1022 in the second direction are basically the same in shape. The embodiments do not make specific limitation to the shapes of the sections of the first pixel defining unit and the second pixel defining unit in the second direction.

The pixel defining structure provided by the embodiment has a plurality of pixel defining groups, the section of the second pixel defining unit at the edge position of each pixel defining group in the first direction has the inward inclination side edge and for example, is of an inverted trapezoid shape, and the inward inclination side edge (for example, the inverted trapezoid) can retard the drying speed of the ink jetted and printed at the edge position of each pixel defining group, so as to reduce the difference among the drying speed of the ink in each pixel defining unit of each pixel defining group to enable the drying speed to tend to be consistent, thereby making the form of the dried ink more uniform and for example, making a thickness and the like of a film formed by the ink more uniform.

An embodiment provides a method for performing jet printing by utilizing the pixel defining structure provided by the above-mentioned embodiment. The method can be used for forming an array substrate, such as an OLED display panel. The method includes: performing jet printing group by group in the pixel defining structure by taking the pixel defining group as unit.

Figure 8:
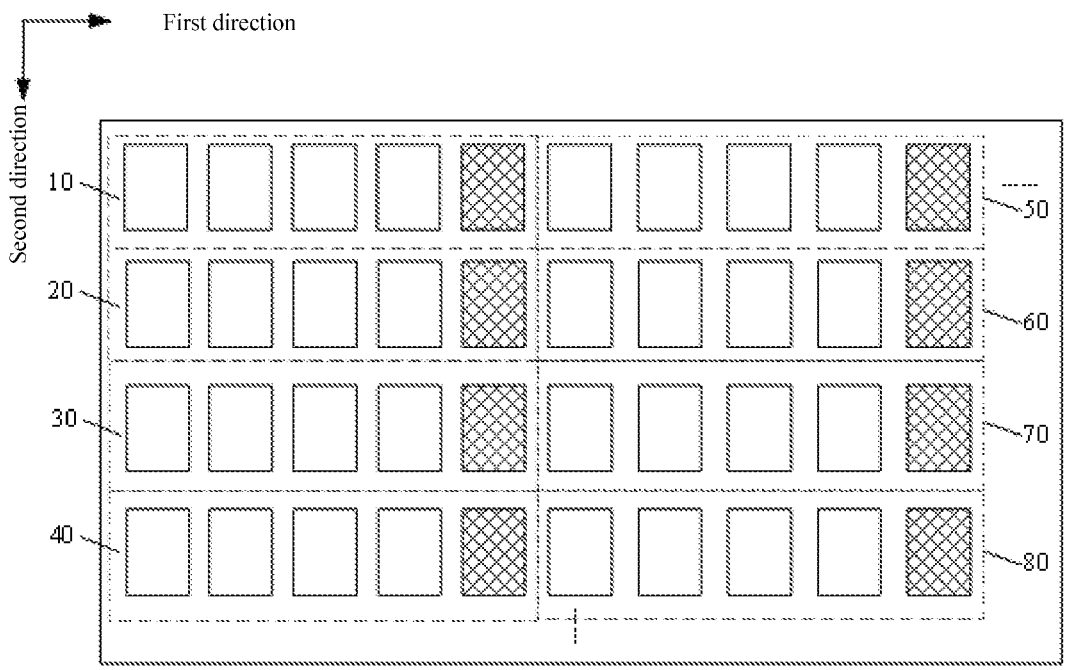
FIG. 8 is a schematic diagram of an jet printing method provided by an embodiment of the present disclosure.

For example, group-by-group jet printing can be carried out along a direction perpendicular to the first direction. For example, as shown in FIG. 8, group-by-group jet printing is carried out along the second direction perpendicular to the first direction. For example, firstly, jet printing of a first pixel defining group 10 is carried out, then jet printing of a second pixel defining group 20, a third pixel defining group 30 and a fourth pixel defining group 40 is sequentially carried out, and after jet printing of a first column of pixel defining groups is completed, jet printing of a second column of pixel defining groups is carried out, and for example, jet printing of a fifth pixel defining group 50, a sixth pixel defining group 60, a seventh pixel defining group 70, an eighth pixel defining group and the like is sequentially carried out.

The jet printing method adopts a mode of performing group-by-group jet printing on the pixel defining structure, and the section of the second pixel defining unit at the edge of each pixel defining group in the first direction includes the inward inclination side edge and for example, includes the inverted trapezoid structure, and the inward inclination side edge can reduce the drying speed of the ink jetted and printed in the edge opening, and thus, the drying speed of the ink jetted and printed into each pixel defining unit in the pixel defining group is basically consistent, so that the form of the dried ink is more uniform.

Figure 9:
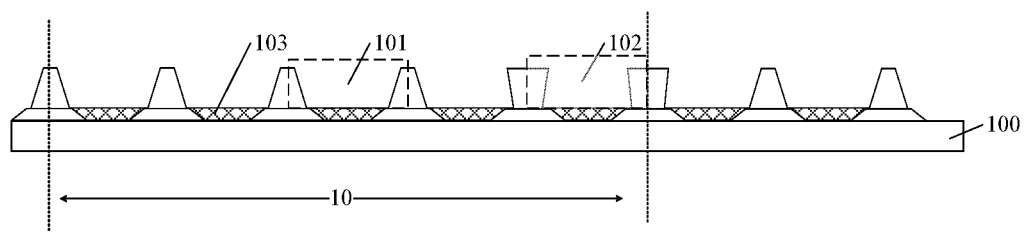
FIG. 9 is a schematic diagram of a display substrate provided by an embodiment of the present disclosure.

At least an embodiment of the present disclosure provides a display substrate. As shown in FIG. 9, the display substrate includes any one of the above-mentioned pixel defining structures, and further includes an organic functional layer 103. The organic functional layer 103 is arranged in the openings formed by the first pixel defining unit 1012 and the second pixel defining unit 1022 of the pixel defining structure.

For example, the organic functional layer 103 may include one or more of a light-emitting layer, an electron injection layer, a hole injection layer, an electron transport layer and a hole transport layer.

For example, a surface of the organic functional layer 103 facing away from the substrate 100 is substantially flush with surfaces of the third pixel defining unit 1011 and the fourth pixel defining unit 1021 facing away from the substrate 100.

In the embodiment, the organic functional layer of the display substrate, for example, may be formed by performing jet printing of an organic material in the opening defined together by the first pixel defining unit 1012 and the third pixel defining unit 1012 of the pixel defining structure and the opening defined together by the second pixel defining unit 1022 and the fourth pixel defining unit 1021 of the pixel defining structure. The pixel defining structure can make the form of the organic functional layer formed by jet printing more uniform, and for example, enable a thickness, a surface topography and the like of the organic functional layer more uniform, so that display uniformity of the display substrate can be improved and the display substrate has a better display effect.

In the embodiment, the display substrate certainly can further include other functional structures, such as a pixel driving circuit, an anode layer, an anode layer, a cathode layer, an insulation layer and the like, which is not repeated in the embodiment.

An embodiment provides a fabrication method of a pixel defining structure, including: forming a plurality of pixel defining units on a substrate, wherein the plurality of pixel defining units include at least one first pixel defining unit and at least one second pixel defining unit which are arranged along a first direction and a second direction which intersect with each other, and each pixel defining unit defines one opening, wherein in at least one cross section of the pixel defining structure, an inward inclination angle of at least one side edge of the at least one second pixel defining unit is smaller than an inward inclination angle of at least one side edge of the at least one first pixel defining unit.

For example, the method includes: forming a plurality of pixel defining groups on the base substrate, which are periodically arranged at least along the first direction; each pixel defining group includes the second pixel defining unit, and the second pixel defining unit is formed at the edge position on one side or both sides of the pixel defining group in the first direction; and for example, in a cross section of the formed second pixel defining unit in the first direction, at least one side edge facing the opening of the second pixel defining unit is formed into an inward inclination side edge, i.e., the side edge is inclined towards the opening of the second pixel defining unit.

In the embodiment, in each pixel defining group 10, for example, the first pixel defining unit 1012 is also formed, and the first pixel defining unit 1012 is at least formed at the middle position in each pixel defining group 10. For example, the first pixel defining unit 1012 and the second pixel defining unit 1022 may have the same layout, and for example, may have the same plane profile and the same opening shape.

For example, in one example of the embodiment, a cross section of the first pixel defining unit in the first direction includes a positive trapezoid portion, the cross section of the second pixel defining unit in the first direction includes an inverted trapezoid portion, and for example, the inward inclination side edge is one hypotenuse of the inverted trapezoid portion.

For example, the fabrication method of the pixel defining structure includes the step S101 to the step S102.

S101: coating a pixel defining structure material on the base substrate.

Figure 10A:
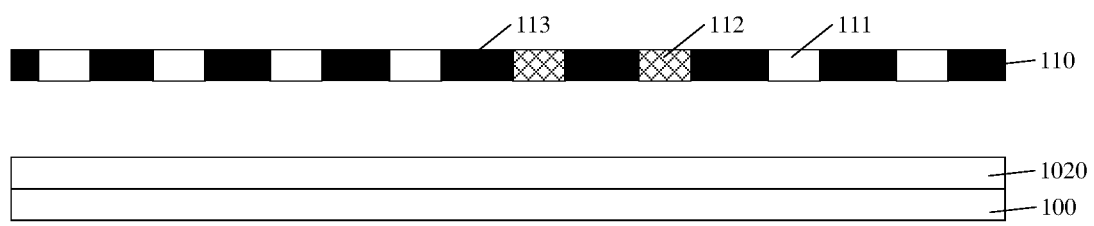
FIG. 10A and FIG. 10B are sectional schematic diagrams of a pixel defining structure during fabrication provided by an embodiment of the present disclosure.

In the embodiment, as shown in FIG. 10A, firstly, the pixel defining structure material 1020 is coated on the base substrate 100. The pixel defining structure material, for example, may be a material with the lyophobic property. The material, for example, may be a negative photoresist material with the lyophobic property, such as PI, PMMA or organic silicon and the like.

In the embodiment, the material with the lyophobic property, which is adopted for forming the pixel defining structure, is difficult to wet by ink, and thus, when the material is used for forming the pixel defining structure, diffusion resistance of the ink in the pixel opening which is to be formed after jet printing can be increased, so as to retard the climbing speed of the ink on the side wall of the pixel opening and prevent the ink from flowing into the adjacent pixel openings.

S102: performing a patterning process to form the first pixel defining unit and the second pixel defining unit.

For example, the patterning process includes: performing exposure and development processes on a pixel defining structure material layer. For example, as shown in FIG. 10A, the exposure process is carried out on the pixel defining structure material layer 1020, such as a negative photoresist material layer, by adopting a duotone mask 110, and when the exposure process is carried out, exposure dose adopted for forming the second pixel defining unit is smaller than exposure dose adopted for forming the first pixel defining unit. For example, the duotone mask 110 includes a fully-transmitted portion 111, a semi-transmitted portion 112 and a fully-non-transmitted portion 113. For example, the fully-transmitted portion 111 corresponds to the positive trapezoid of the first pixel defining unit to be formed, the semi-transmitted portion 112 corresponds to the inverted trapezoid of the second pixel defining unit to be formed, and the fully-non-transmitted portion 113 is a remaining portion of the duotone mask 110 and for example, corresponds to an opening portion of the respective pixel defining units to be formed.

Figure 10B:
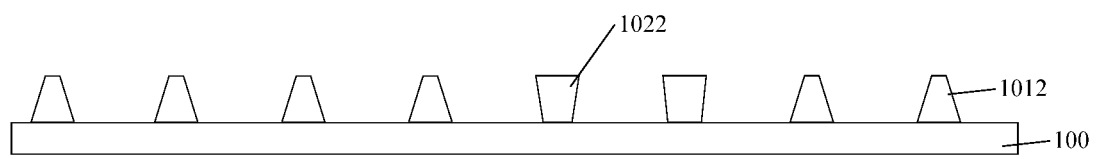

For example, after the exposure process is completed, the development process is carried out; because the pixel defining structure material of the embodiment adopts the negative photoresist material, the material in the exposed region is not dissolved in the later development process, so as to form the pixel defining structure as shown in FIG. 10B.

For example, in another example of the embodiment, the method further includes: sequentially forming a first layer of pixel defining units and a second layer of pixel defining units on the base substrate, and the second layer of pixel defining units are formed to have the inverted trapezoids.

Further, for example, in this example, the first layer of the pixel defining units is formed to include a plurality of third pixel defining units and at least one fourth pixel defining unit between the plurality of first pixel defining units and the at least one second pixel defining unit and the substrate, wherein the plurality of third pixel defining units and the plurality of first pixel defining units are correspondingly overlapped, and the at least one fourth pixel defining unit and the at least one second pixel defining unit are correspondingly overlapped, wherein in the at least one cross section of the pixel defining structure, at least one side edge of each third pixel defining unit is an outward inclination side edge, and at least one side edge of the at least one fourth pixel defining unit is an outward inclination side edge.

For example, in this example, the first pixel defining unit and the second pixel defining unit are formed by adopting one patterning process; and the third pixel defining unit and the fourth pixel defining unit are formed by adopting another patterning process. For example, the first pixel defining units and the second pixel defining units in the second layer are formed by adopting the negative photoresist material with the lyophobic property. For example, the third pixel defining units and of the fourth pixel defining units in the first layer are formed by adopting a lyophilic material, such as silicon dioxide, silicon nitride or silicon oxynitride and the like.

Figure 11A:
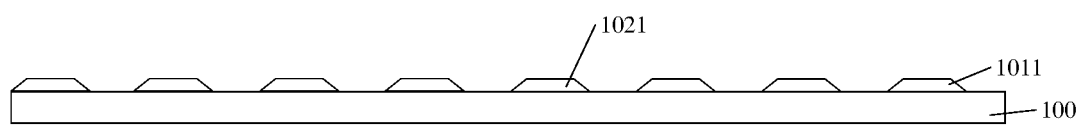
FIG. 11A and FIG. 11B are other sectional schematic diagrams of a pixel defining structure during fabrication provided by an embodiment of the present disclosure.
Figure 11B:
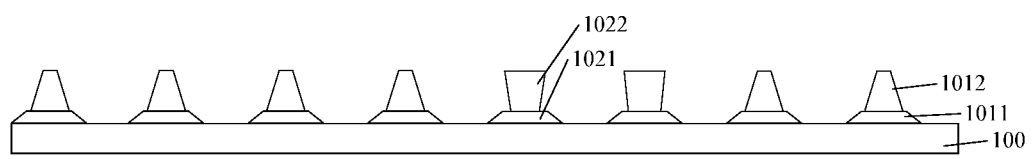

For example, in this example, as shown in FIG. 11A, the third and fourth pixel defining units 1011 and 1021 can be firstly formed on the base substrate. For example, the third pixel defining unit and the fourth pixel defining unit are the same in structure. For example, firstly, a layer of pixel defining unit material is formed, then one patterning process is carried out on the layer of pixel defining unit material (e.g., coating a layer of photoresist material and then performing processes such as exposure, development, etching and the like) to form the third and fourth pixel defining units; and then another layer of pixel defining unit material is formed on the third and fourth pixel defining units, and for example, the exposure process and the development process are carried out by utilizing the duotone mask so as to form the first and second pixel defining units. For example, when the exposure process is carried out, exposure dose adopted for forming the second pixel defining unit 1022 is smaller than exposure dose adopted for forming the first pixel defining unit 1012. The specific forming mode of the pixel defining unit can refer to the previous example and is not repeated herein. In this example, finally, the pixel defining structure as shown in FIG. 11B is formed.

The pixel defining structure formed by utilizing the fabrication method provided by the embodiment has a plurality of pixel defining groups, the section of the second pixel defining unit at the edge position of each pixel defining group in the first direction has the inward inclination side edge and for example, has the inverted trapezoid portion, and the inward inclination side edge (for example, the inverted trapezoid) can retard the drying speed of the ink jetted and printed at the edge position of each pixel defining group, so as to reduce the difference among the drying speed of the ink in each pixel defining unit of each pixel defining group to enable the drying speed to tend to be consistent, thereby making the form of the dried ink more uniform and for example, making a thickness and the like of the film formed by the ink more uniform.

Figure 12:
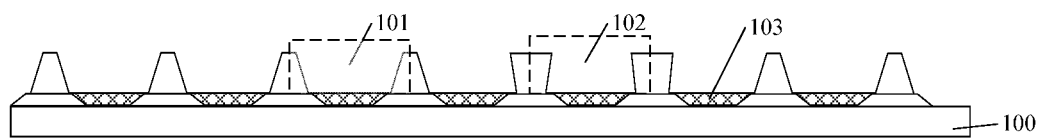
FIG. 12 is a sectional schematic diagram of a display substrate during fabrication provided by an embodiment of the present disclosure.

An embodiment provides a fabrication method of a display substrate. As shown in FIG. 12, the fabrication method of the display substrate includes: forming any one of the above-mentioned pixel defining structures, and performing jet printing of an organic material in the pixel defining structure by adopting any one of the above-mentioned jet printing methods so as to form an organic functional layer.

In the embodiment, as shown in FIG. 12, firstly, the pixel defining structure is formed, and then jet printing of the organic material is carried out in the opening defined together by the first pixel defining unit 1012 and the third pixel defining unit 1012 of the pixel defining structure and in the opening defined together by the second pixel defining unit 1022 and the fourth pixel defining unit 1021 of the pixel defining structure so as to form the organic functional layer 103. The organic functional layer 103, for example, may be one or more of an organic light-emitting layer, an electron injection layer, a hole injection layer, an electron transport layer and a hole transport layer, and the embodiment does not limit thereto.

The fabrication method of the display substrate, which is provided by the embodiment, can form a more uniform organic functional layer in the respective pixel defining units and for example, form an organic functional layer which is more uniform in thickness, surface topography and the like. Therefore, the organic light-emitting display substrate formed by utilizing the method provided by the embodiment has higher display uniformity, so that a display apparatus obtained by the display substrate has a better display effect.

In the present disclosure, several points below should be noted:

(1) The drawings of the embodiments of the present disclosure are only related to structures to which the embodiments of the present disclosure relate, and other structures can refer to general design.

(2) For clarity, in the drawings for describing the embodiments of the present disclosure, a thickness of a layer or a region is amplified or reduced, i.e., those drawings are not drawn according to an actual scale. It can be understood that when a component, such as the layer, the film, the region or the substrate, is called to be positioned "on" or "under" another component, the component can be "directly" positioned "on" or "under" another component or an intermediate component can present.

(3) In case of no conflict, the embodiments of the present disclosure and the characteristics in the embodiments can be combined with each other to obtain new embodiments.

The foregoing embodiments merely are exemplary embodiments of the disclosure, and not intended to define the scope of the disclosure, and the scope of the disclosure is determined by the appended claims.

The invention claimed is:

1. A pixel defining structure, comprising:
a substrate, and
a plurality of pixel defining units on the substrate, including a plurality of first pixel defining units which are arranged along a first direction and a second direction which intersect with each other and a plurality of second pixel defining units which are arranged along the first direction and the second direction, wherein each pixel defining unit of the plurality of pixel defining units has a first surface and a second surface opposite to each other and an opening communicating the first surface with the second surface,
wherein the pixel defining structure is configured to form an array substrate of an organic light-emitting diode display panel, in at least one cross section of the pixel defining structure along the first direction, an inclination angle of a side edge of each pixel defining unit of the plurality of pixel defining units on one side of the opening is an included angle between a straight connection line of two end points of the side edge and a surface portion of the substrate exposed by the opening, the two end points of the side edge are an intersection of the side edge and the first surface and an intersection of the side edge and the second surface respectively, and the inclination angle of at least one side edge of each of the plurality of second pixel defining units is smaller than the inclination angle of at least one side edge of each of the plurality of first pixel defining units,
wherein the plurality of second pixel defining units include at least three second pixel defining units sequentially adjacent along the first direction, the inclination angles of the side edges of the at least three second pixel defining units sequentially adjacent along the first direction are sequentially decreased,
the inclination angle of the at least one side edge of each of the plurality of second pixel defining units is an acute angle.

2. The pixel defining structure according to claim 1, wherein the plurality of second pixel defining units include a plurality of second pixel defining units sequentially adjacent along the second direction.

3. The pixel defining structure according to claim 2, wherein the inclination angles of the side edges of the plurality of second pixel defining units sequentially adjacent along the second direction are equal in essence.

4. The pixel defining structure according to claim 1, wherein the inclination angle of the at least one side edge of each of the plurality of first pixel defining units is an obtuse angle.

5. The pixel defining structure according to claim 1, wherein the plurality of pixel defining units further include:
a plurality of third pixel defining units, located between the plurality of first pixel defining units and the substrate; and
a plurality of fourth pixel defining units, located between the plurality of second pixel defining units and the substrate,
wherein the plurality of third pixel defining units and the plurality of first pixel defining units are correspondingly overlapped, and the plurality of fourth pixel defining units and the plurality of second pixel defining units are correspondingly overlapped,
wherein in the at least one cross section of the pixel defining structure along the first direction, the inclination angle of at least one side edge of each of the plurality of third pixel defining units is an obtuse angle, and the inclination angle of at least one side edge of each of the plurality of fourth pixel defining units is an obtuse angle, and the inclination angle of at least one side edge of each of the plurality of fourth pixel defining units and the inclination angle of at least one side edge of each of the plurality of fourth pixel defining units are greater than the inclination angle of at least one side edge of each of the plurality of first pixel defining units.

6. The pixel defining structure according to claim 5, wherein a material of the plurality of first pixel defining units and the plurality of second pixel defining units is a lyophilic material; and
a material of the plurality of third pixel defining units and the plurality of fourth pixel defining units a lyophilic material.

7. The pixel defining structure according to claim 5, wherein in a direction perpendicular to the substrate, both a thickness of the plurality of first pixel defining units and a thickness of the plurality of second pixel defining units are greater than both a thickness of the plurality of third pixel defining units and a thickness of the plurality of fourth pixel defining units.

8. The pixel defining structure according to claim 1, wherein the pixel defining structure further comprises a plurality of pixel defining groups periodically arranged at least along the first direction, each of the plurality of pixel defining groups comprises a plurality of first pixel defining units and a plurality of second pixel defining units, and in each of the plurality of pixel defining groups, the number of the plurality of second pixel defining units sequentially adjacent along the first direction is 2 to 5.

9. A jet printing method for printing the pixel defining structure according to claim 1, comprising:
simultaneously jetting a material to at least part of the plurality of pixel defining groups by adopting a plurality of nozzles in one-to-one correspondence, wherein at least one jet nozzle at an edge of the plurality of nozzles jets the material to at least one of the plurality of second pixel defining units.

10. The jet printing method according to claim 9, further comprising: jetting the material row by row along the second direction intersecting with the first direction by adopting the plurality of nozzles.

11. A display substrate, comprising the pixel defining structure according to claim 1 and an organic functional layer;
wherein the organic functional layer is positioned in the openings defined by at least part of the plurality of pixel defining units.

12. The display substrate according to claim 11, wherein the organic functional layer includes at least one selected from the group consisting of a light emitting layer, an electron injection layer, a hole injection layer, an electron transport layer and a hole transport layer.

13. The display substrate according to claim 11, wherein the plurality of pixel defining units further include:
a plurality of third pixel defining units, located between the plurality of first pixel defining units and the substrate; and
a plurality of fourth pixel defining units, located between the plurality of second pixel defining units and the substrate,
wherein the plurality of third pixel defining units and the plurality of first pixel defining units are correspondingly overlapped, and the plurality of fourth pixel defining units and the plurality of second pixel defining units are correspondingly overlapped,
wherein in the at least one cross section of the pixel defining structure along the first direction, the inclination angle of at least one side edge of each of the plurality of third pixel defining units is an obtuse angle, and the inclination angle of at least one side edge of each of the plurality of fourth pixel defining units is an obtuse angle, and the inclination angle of at least one side edge of each of the plurality of fourth pixel defining units and the inclination angle of at least one side edge of each of the plurality of fourth pixel defining units are greater than the inclination angle of at least one side edge of each of the plurality of first pixel defining units,
wherein a surface of the organic functional layer facing away from the substrate is substantially flush with surfaces of the plurality of third pixel defining units and the plurality of fourth pixel defining units face away from the substrate.

14. The display substrate according to claim 13, wherein a material of the plurality of first pixel defining units and the plurality of second pixel defining units is a lyophobic material; and
a material the plurality of third pixel defining units and the plurality of fourth pixel defining units is a lyophilic material.

15. The display substrate according to claim 13, wherein in a direction perpendicular to the substrate, both a thickness of the plurality of first pixel defining units and a thickness of the plurality of second pixel defining units are greater than both a thickness of the plurality of third pixel defining units and a thickness of the plurality of fourth pixel defining units.

16. A fabrication method of a pixel defining structure, comprising:
forming a plurality of pixel defining units on a substrate, wherein the plurality of pixel defining units include a plurality of first pixel defining units which are arranged along a first direction and a second direction which intersect with each other and a plurality of second pixel defining units which are arranged along the first direction and the second direction, wherein each pixel defining unit of the plurality of pixel defining units has a first surface and a second surface opposite to each other and an opening communicating the first surface with the second surface,
wherein the pixel defining structure is configured to form an array substrate of an organic light-emitting diode display panel, in at least one cross section of the pixel defining structure along the first direction, an inclination angle of the side edge of each pixel defining unit of the plurality of pixel defining units on one side of the opening is an included angle between a straight connection line of two end points of the side edge and a surface portion of the substrate exposed by the opening, the two end points of the side edge are an intersection of the side edge and the first surface and an intersection of the side edge and the second surface respectively, and the inclination angle of at least one side edge of each of the plurality of second pixel defining units is smaller than the inclination angle of at least one side edge of each of the plurality of first pixel defining units,
wherein the plurality of second pixel defining units include at least three second pixel defining units sequentially adjacent along the first direction, the inclination angles of the side edges of the at least three second pixel defining units sequentially adjacent along the first direction are sequentially decreased,
the inclination angle of the at least one side edge of each of the plurality of second pixel defining units is an acute angle.

17. The fabrication method of the pixel defining structure according to claim 16, further comprising:
forming a plurality of third pixel defining units between the plurality of first pixel defining units and the substrate; and
forming a plurality of fourth pixel defining units between the plurality of second pixel defining units and the substrate;
wherein the plurality of third pixel defining units and the plurality of first pixel defining units are correspondingly overlapped, and the plurality of fourth pixel defining units and the plurality of second pixel defining units are correspondingly overlapped,
wherein in the at least one cross section of the pixel defining structure along the first direction, the inclination angle of at least one side edge of each of the plurality of third pixel defining units is an obtuse angle, and the inclination angle of at least one side edge of each of the plurality of fourth pixel defining units is an obtuse angle.

* * * * *